(12) United States Patent
Kung et al.

(10) Patent No.: US 6,692,265 B2
(45) Date of Patent: Feb. 17, 2004

(54) ELECTRICAL CONNECTION DEVICE

(75) Inventors: Moriss Kung, Taipei (TW); Kwun-Yao Ho, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/201,090

(22) Filed: Jul. 23, 2002

(65) Prior Publication Data

US 2003/0114023 A1 Jun. 19, 2003

(30) Foreign Application Priority Data

Dec. 18, 2001 (TW) ...................................... 90222115 U

(51) Int. Cl.[7] .............................................. H10R 12/00
(52) U.S. Cl. ........................ 439/68; 439/857; 439/856; 439/83
(58) Field of Search ................................ 439/857, 856, 439/342, 83, 78, 70, 259–265

(56) References Cited

U.S. PATENT DOCUMENTS

| | | | | |
|---|---|---|---|---|
| 5,144,535 A | * | 9/1992 | Megens et al. | 361/400 |
| 5,973,394 A | * | 10/1999 | Slocum et al. | 257/690 |
| 6,142,810 A | * | 11/2000 | Hsiao et al. | 439/342 |
| 6,155,845 A | * | 12/2000 | Lin et al. | 439/83 |
| 6,257,899 B1 | * | 7/2001 | Walkup | 439/66 |
| 6,268,568 B1 | * | 7/2001 | Kim | 174/250 |
| 6,383,005 B2 | * | 5/2002 | Ho et al. | 439/331 |
| 6,504,105 B1 | * | 1/2003 | Acocella et al. | 174/255 |

* cited by examiner

*Primary Examiner*—Alexander Gilman

(57) ABSTRACT

An electrical connection device comprises a socket, a plurality of electrical conducting holder in between, a contact ring and a plurality of solder balls. A plurality of pin holes are placed on the socket to provide the insert function for the pins of a IC package. The electrical conducting holder is placed in the pin holes and comprises an extensional part, a holder on the top of the extension part and a solder pad on the bottom part of the extension part to combine the solder ball. At least one 2D or 3D geometrical structure such as the hole, the convex and concave part or the slope on the bottom surface of the solder pad is formed. The geometrical structure will make the bottom surface of the solder pad not the flat plane. With the geometrical structure and the contact ring, the contact area of the solder pad and the contact ring will be enlarged during the solder reflow process. The coupling effect will be better and meanwhile improve the characteristics of the electricity, the intensity of the structure, the production yield and the characteristics of the co-planarity.

26 Claims, 12 Drawing Sheets

ELECTRICAL CONNECTION DEVICE

BACKGROUND OF THE INVENTION (a) Field of the Invention

The present invention relates to an electrical connection device. Especially, the present invention relates to the structure improvement of the electrical connection device soldered on a main board by solder balls, wherein the device can be provided for inserting and placing an IC package.

(b) Description of the Prior Art

For long time, there are two ways that placing the Integrated Circuit (IC) Package on the Circuit Board (or Main Board). In one of the two ways, the IC is soldered fixedly on the main board and can not be removed. Another way the IC is replaceable. The replaceable electrical connecting device and the IC combining device are usually suitable in a IC package that needs upgrade sometimes or in a IC package with high price. In the case that one of the IC package broken and needs to be replaced, other packages can be kept. The best example is the socket and the circuit board connecting device that used for a Central Processing Unit (CPU).

Please refer to FIG. 1 and FIG. 2, which showing the typical replaceable IC package and the composition device of the electrical connecting device and the main board in the market. Conventionally, in order to maintain the excellent electrical connection and the replaceable-ness, the pins 111 are placed on the IC package 11 and the socket 13 with a plurality of pin holes 131 is set on the circuit board 12 to connect the IC package 11. In prior art, there are two package methods to pack an IC package, namely Lead Frame and Ball Grid Array (BGA). In recent years, the Flip Chip BGA Packaging is often used for an IC package that needs high efficiency and high number of pins. FIG. 1 is showing its basic devices, which comprising the IC chip 112 being placed on one side of the substrate 113 by the Flip Chip method, several solder balls 114 being placed on the another side of the substrate 113 that connected electrically to the chip 112 thru the circuit layout of the substrate 113, and the heat sink 115 is attached on the other side of the chip 112 that will not operate. Since the pin 111 is not hard and still enough, it is easy to be distorted and damaged during replacement. So in practice, a plurality of the pins 111 will be molded and fixed on a interposer 116 before it soldered on the solder ball 114.

Traditionally, the plugged-in electrical connection device 13 is composed of the following elements in order to maintain the replaceable feature. The elements include of the main board 12 on which there are the sockets 132 with a plurality of the pin hole 131, a slide 133 that can be moved linearly on top of the socket 132 and a pulling long stick 134 placed on the side of the socket 132 to drive the slide 133 to move slightly. There is electrical conducting holder 137 placed in each pin hole 131 on the socket 132. And the solder pad 135 is formed on the bottom part of the pin hole 131. The pin hole 131 is extended from the bottom part of the electrical conducting holder 137 to form the pins 1371 in order to provide several Plated Through Holes (PTH) 121 on the main board 12 to plug in. The electrical conducting layer 122 in the PTH 121 on the main board 12 provides the function of the electrical connection with the pins 1371. The position of the PTH 121 and the position of the upper contact pad 1221 on the upper surface of the main board 12 is defined by the SMD (Solder Mask Defined) or NSMD (None Solder Mask Defined). The pins 1371 and the electrical connection device 13 are soldered firmly on the main board 12 by using the solder 123 and the solder 125. Corresponding to the positions of the pin holes 131 on the slide 133 exist several bigger holes. Pulling down the pulling stick 134 and rotating it around the stick 136 until the pulling stick 134 being parallel with the socket 132 will make the slide 133 move slightly and hold the pins 111 of the IC device 11 tightly in the pin holes 131. When pulling out the IC device 11, the pulling stick 134 has to be moved until it making a 90 degree angle with the socket 132 to loose the pins 111 from the IC device 11 by the way.

Please refer to FIG. 3 and FIG. 4, which are showing another composition of the replaceable IC device and the electrical connection device and the main board. As shown, the structure of the IC device 11 in prior art is similar to the structure of the electrical connection device 13a in FIG. 1. The major difference is that the bottom part of the socket of the electrical connection device 13a in FIG. 3 is ball structure instead of pin structure. And the lower part of the electrically conducting holder 137a in the electrical connection device 13a is bent 90 degree to be the solder pad 139 which combines the solder ball 138. And instead of the PTH, the solder pad 126 is placed on the main board 12a. The solder ball 138 will be soldered firmly between the two solder pads 139 and 126 stably by performing the solder reflow on the solder ball 138 in the electrical connection device 13a and the solder pad 126 on the main board 12a. The disadvantages in prior art are that the solder pad 139 on the bottom part of the electrically conducting holder 137a in the electrical connection device 13a and the solder pad 126 on the main board 12a are flatly planar structures. So, the solder ball 138 and the solder pad 139 and 126 are combined plainly. The contact area is limited, the electrical characteristic is bad and the intensity of the structure of the combination is weaker. The disadvantages lead the rising of the defects of the products and sometimes the department of the solder ball 138. Also, the overflow of the solder ball 138 will lead the circuit shortage and the electrical instability. In the same time the disadvantage also includes the bad co-planarity between the electrical connection device 13a and the main board 12a.

SUMMARY OF THE INVENTION

The primary aspect of the present invention is to provide an electrical connection device. By special design of geometry structure, the present invention will lead the strong intensity, the electrical characteristics and the co-planarity of the product, and the yield of the product after the solder reflow of the solder pad on the bottom part of the electrically conducting holder and the solder ball.

Another aspect of the present invention is to provide an electrical connection device which having a contact ring optionally on the bottom parts of the pin holes in the sockets to enlarge the contact area between the solder ball, the sockets and the electrically conducting holders.

The third aspect of the present invention is to provide an electrical connection device which having a contact ring optionally on the bottom parts of the pin holes in the sockets, and at least a portion of the contact ring is with difference in height with the solder pad on the bottom part of the electrically conducting holder, with this difference of horizontal altitude between the geometric structure, the present invention will enlarge the contact area between the solder ball, the sockets and the electrical conducting holders, The fourth aspect of the present invention is to provide an electrical connection device. With increasing a additional convex part on the bottom surface of the pin holes in the sockets to contact the periphery of the solder pad on the bottom part of the electrically conducting holder, the present invention will avoid the solder material in siphon phenomenon between the electrically conducting holder and the pin holes in the solder reflow process. And because the additional convex part placed against the solder ball, which will avoid the electrical conducting holder from being released or removed that caused by the pushing force of the solder ball. In one of the embodiment of the electrical conducting device of the present invention, we increase the contact area of the solder ball and socket after the solder reflow process by the suitable geometrical design. Example that we design the solder pad on the bottom part of the electrical conducting metal to have the concave and convex part, the holes and the slope to produce the difference in height. Or we can increase a contact ring optionally in the area of the solder pad to create the difference of the heights between the contact ring and the solder pad to increase the contact area in the solder reflow process for the solder pad, the contact ring and the solder ball. And the solder ball will flow into the concave and convex part of the solder pad, the hole or the slope partly to achieve the effect of inlaying. And with the improvement described above, the contact area will be enlarged, the electrical characteristics, the intensity, the coplanarity and the yield will be better.

DETAILED DESCRIPTION OF THE PRESENT INVENTION

The major feature of the present invention is to enlarge the contact area of the solder ball and the socket by the suitable design of the geometrical structure after the solder reflow process. The contact area between the bottom part of the socket and the solder ball can be produced as the difference in height of the concave and convex part of the solder pad on the bottom part of the electrical conducting metal or can be the holes or the slope. Or, an extra contact ring in the area of the solder pad can be added optionally. The contact area also can be enlarged by the different height between the contact ring and the solder pad by the design of the geometrical structure. Part of the solder ball will flow into the convex and concave part of the solder pad, the hole and the slope in the solder reflow process to achieve the coupling effect. Enlarged contact area will also improve the electrical characteristics, the intensity of the structure and the yield of the product.

The following embodiments will describe the electrical connection device of the present invention about the detailed evolvement, the effect and the other technical characteristics.

Figure 5:
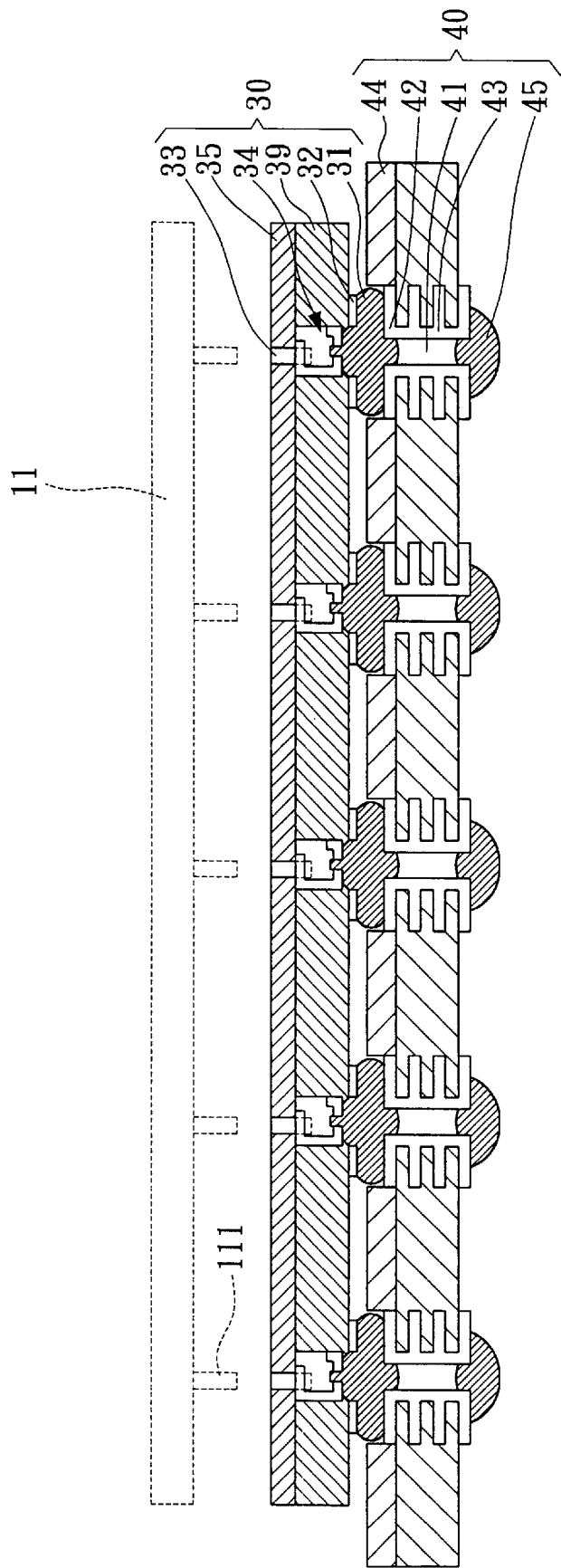
FIG. 5 shows the side view of the first embodiment of the electrical connection device in the present invention.
Figure 6:
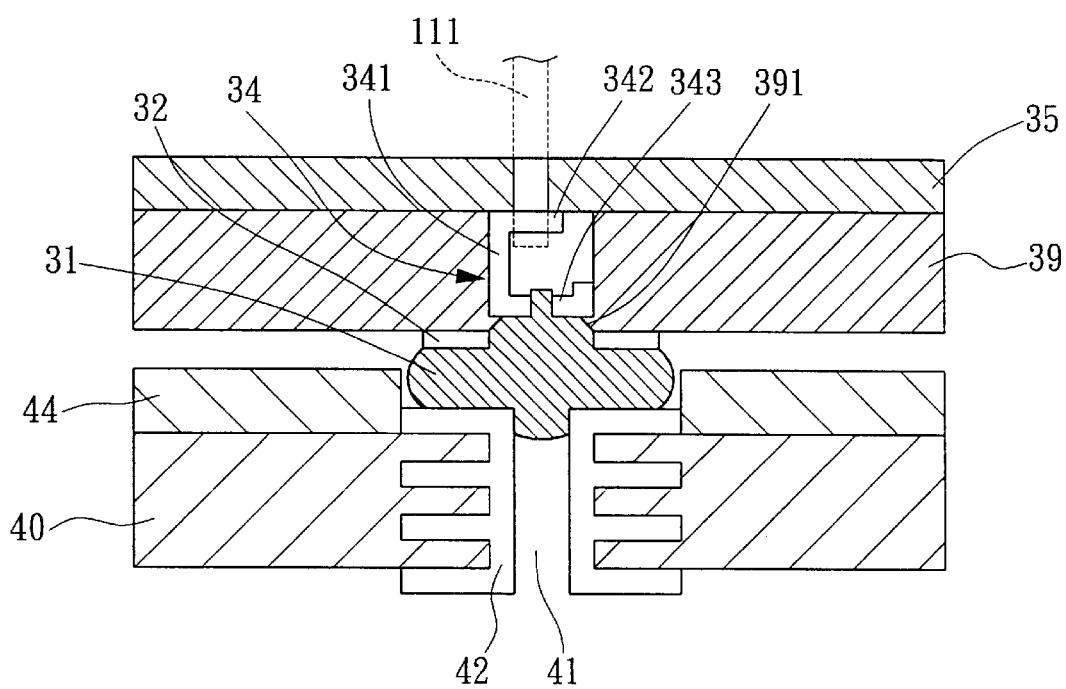
FIG. 6 shows the enlarged view of the electrical conducting holder part of the electrical connection device in FIG. 5.
Figure 7:
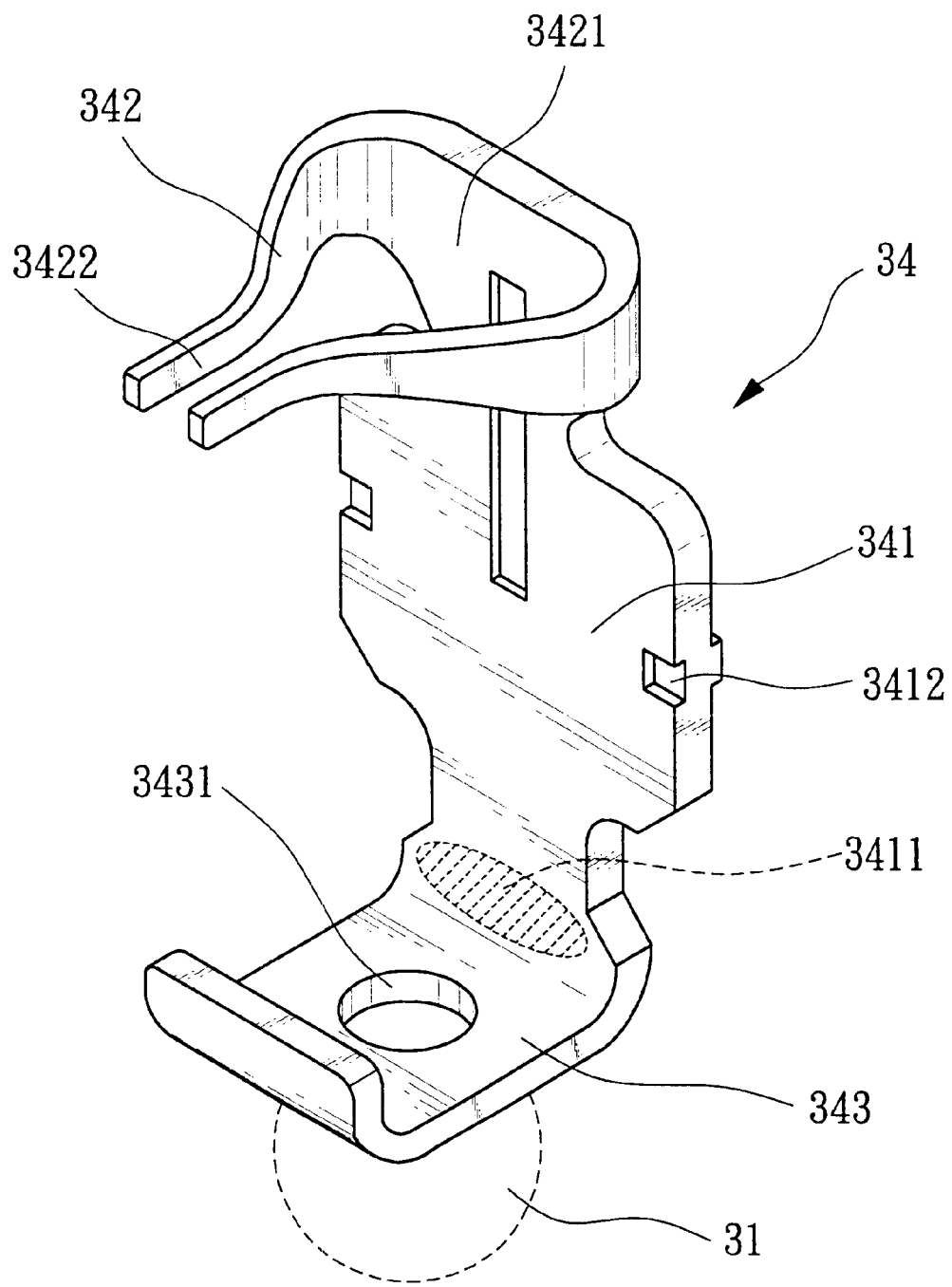
FIG. 7 shows the embodiment of the three-dimensional view of the electrical conducting holder of the electrical connection device in FIG. 5.

Please refer to FIG. 5, FIG. 6 and FIG. 7. The schematics show the side view of the first embodiment of the electrical connection device 30 in the present invention. The electrical connection device 30 will apply on the pin-style IC Package 11 and the main board to connect them electrically.

In this embodiment, several pins 111 in the IC Package 11 exist. The structure in this embodiment is as the same as in prior art. Since the IC Package 11 is not the major technical characteristics of the present invention and it will not be described in details but just shown in dash line.

As shown, the electrical connection device 30 comprises one slide cover mechanism 35, one socket 39, a plurality of the electrical conducting holders 34, a plurality of the solder balls 31 and a plurality of the contact rings 32. The contact rings 32 described above are optional devices. There is a plurality of the corresponding pin holes 33 on the socket and the slide cover mechanism and the positions of the pin hole 33 are placed correspondingly to the pins 111 of the IC Package 11 to provide the function of combining the pin holes 33 of the socket 39 with the IC Package 11. And the IC Package 11 can be removed when necessary.

A plurality of the electrical conducting holders 34 are placed in the corresponding pin holes 33. Every electrical conducting holder 34 is a model injection single device formed by bending metal. The electrically conducting holder 34 can be made of Nickel, Gold, Chromium, Copper, Iron, Aluminum, Titanium, Lead, Tin or other compound. And the surface of the electrical conducting holder can be electroplated with different metal materials. Each electrical conducting holder 34 comprises an extension part 341, a holder 342 and a solder pad 343. The extension part 341 is placed along the extension of the pin hole 33. The blocking structure 3412 is set in the proper place of the extension part 341 and it will provide the holding force to the pin hole 33 of the socket 39 to prevent the dropping of the electrically conducting holder 34 from the pin hole 33. The holder part 342 is positioned at one end of the extension part 341. And the holder part is formed a predetermined angle with the extension part. The pin 111 can be inserted into the holder part 342. Please refer to FIG. 7. The holder part 342 comprises two holder arms extending in the same direction and departing from each other in a proper distance. A bigger space 3421 and smaller space 3422 are formed by bending the two holder arms in proper way. The the bigger space 3421 is little bigger than the diameter of the pin 111, so the pin 111 can be inserted into the space 3421, and the small space 3422 is smaller than the diameter of the pins 111 to provide function of holding. The solder pad 343 is positioned on another end of the extension part 341 and is forming a predetermined angle with the extension part 341. At least one 2D or 3D geometrical structure 3431 exists on the bottom surface of the solder pad 343 departing from the holder. The geometrical structure 3431 will make the bottom surface of the solder pad 343 not a flat plane. The embodiment in FIG. 5, FIG. 6 and FIG. 7 show the geometrical structure 3431 that is a circle-shape hollow hole in the closed state and penetrating through the solder pad. In the positioning section of the solder reflow process, the geometrical structure 3431 will provide better positioning function, which enable the solder ball 31 to be positioned easily.

The slide cover mechanism 35 is set on the side surface of the socket 39 toward the direction of the IC Package 11 in sliding manner. When the IC Package 11 being placed in the pin hole 33 of the socket 39, sliding the slide cover mechanism 35 in limited distance will move the pins 111 from the hollow 3421 to the holder 3422 to make the IC Package 11 be held tightly and stably in the socket 39. The slide cover mechanism 35 can be a conventional slide board or a pulling stick mechanism as in prior art and is not the major technical characteristics of the present invention, the details will not be described hereafter.

The solder balls 31 are composed of Pb/Sn, Sn/Cu, Sn/Cu/Ag, Bi/Ti, Au/Sn or other compositions. For the Pb/Sn solder ball, the ratio of Sn is between 5 percent to 95 percent and Pb is between 95 percent to 5 percent. The better ratio of Sn/Pb of the solder balls 31 will be between 60/40 and 75/25 in the present invention. In general, the totally melting temperature of the solder ball is 183 degrees which is the Eutectic point of Sn/Pb at ratio 63/37. However, in the present invention, the ratio could be between 60/40 and 75/25, which will change the totally melting temperature (i.e. Liquidus temperature) of the solder balls 31 to between 190 degrees and 195 degrees. Therefore, the solder ball 31 will be in a controllable semi-liquid state in the solder reflow process.

The contact ring 32 is hollow ring structure and is placed on the pin holes 33 toward the direction around the end of the solder pad 343. In this embodiment, the bottom side surface of the socket 39 is a plane and the contact ring 32 is added additionally on the side of bottom surface of the socket 39. Therefore, the solder pad 343 and the bottom side surface of the socket 39 are on the same plane, however, which will generate a difference in height between the contact ring 32 and the solder pad 343.

One upper surface of the main board 40 combines electrically with the electrical connection device 30 through the solder ball 31. In this preferred embodiment, the main board 40 comprises several PTH 41 and the positions of PTH 41 are correspondent to several solder balls 31. The top side of the PTH 41 will form the solder pad 42 to combine with the solder ball 31 under the socket 39. The inner surface of the PTH 41 is placed with the electrically conducting layer 43. The upper surface of the main board 40 is placed with a non-electrically conducting layer (SMD or NSMD) 44. SMD 44 is used to define the positions of the PTH 41 and the solder pad 42 of each PTH 41 is not covered by the SMD 44. So, the solder pad 42 is exposed on the main board 40 to combine with the solder ball 31 of the socket. The bottom side surface of the main board 40 can be set on the bottom part of the PTH 41 by the additive soldering balls 45.

Before the electrical connection device of the present invention and the main board entering the solder reflow process, the socket 39 and the main board 40 are depart, and the solder ball 31 is in the spherical state. When in solder reflow process, the solder ball 31 will be formed in semi-liquid state, and a part of the solder ball 31 will flow into the holes (the geometry structure 3431) of the solder pad 343. So, the contact area among the solder ball 31, the contact ring 32, the contact area of the solder ball 31 and the solder pad 343 will be increased. And the coupling effect will be achieved for the solder ball 31 is fulfilled in the holes of the solder pad 343. The electrical characteristics, the intensity of the structure, and yield of the product will be improved. Also, the holes will be used as a space for extra material to hold extra solder in solder reflow process. The co-planarity of the electrical connection device 30 employing the technology of the present invention and the main board 40 is much better than in prior art.

Please refer to FIG. 6. The bottom end of the holes 33 of the socket 39 in the present invention will place additionally a convex 391 in the inner direction of the hole 33. The convex 391 can be placed around the solder pad 343 under the electrical conducting holder 34. The way described above not only provide the positioning function in placing the electrical conducting holder 34 but also avoid the absorbing phenomenon of the solder ball 31 between the electrical conducting holder 34 and the hole 33 in the solder reflow process. The convex 391 will also hold the solder ball 31 to avoid the drop of the electrical conducting holder 34 caused by the force of the solder ball 31 pushing upward during the solder reflow process.

Figure 1:
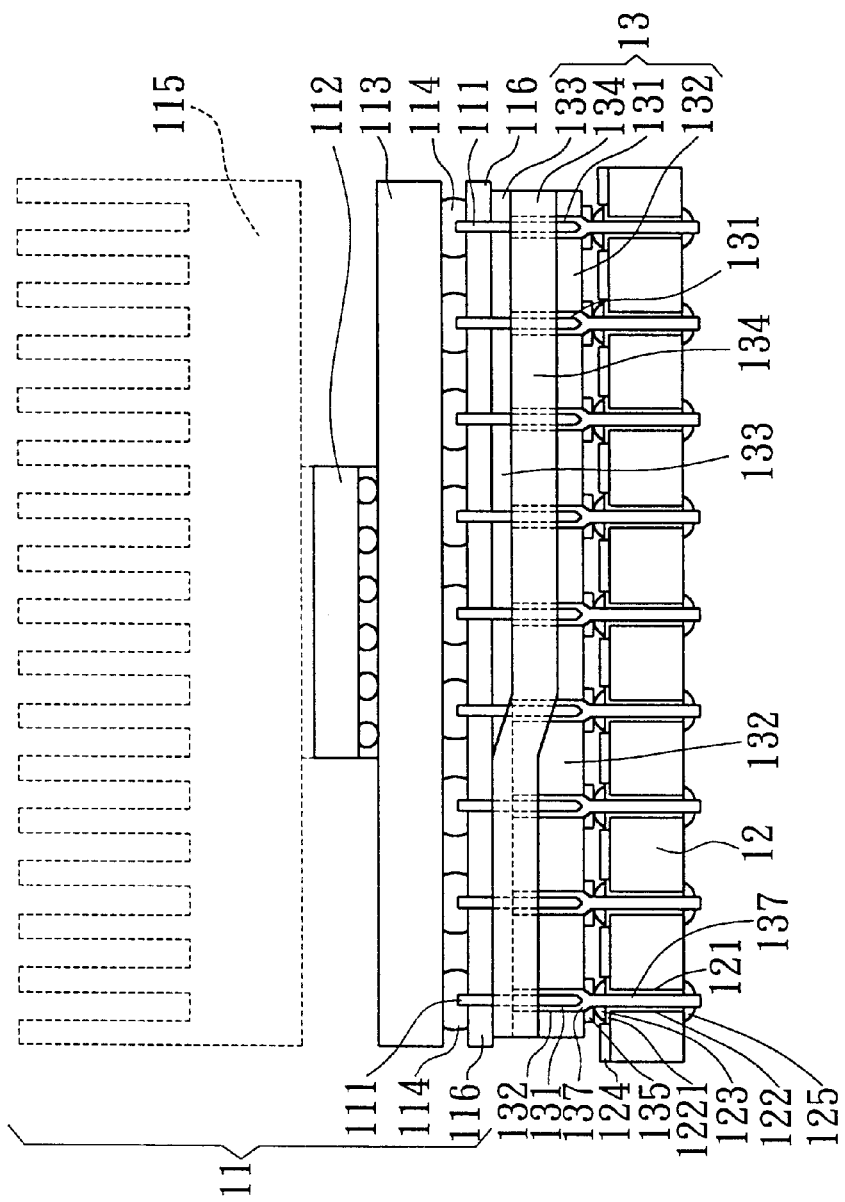
FIG. 1 shows the side view of the composition of the IC device and the pin-style electrical connection device and the main board in prior art.
Figure 2:
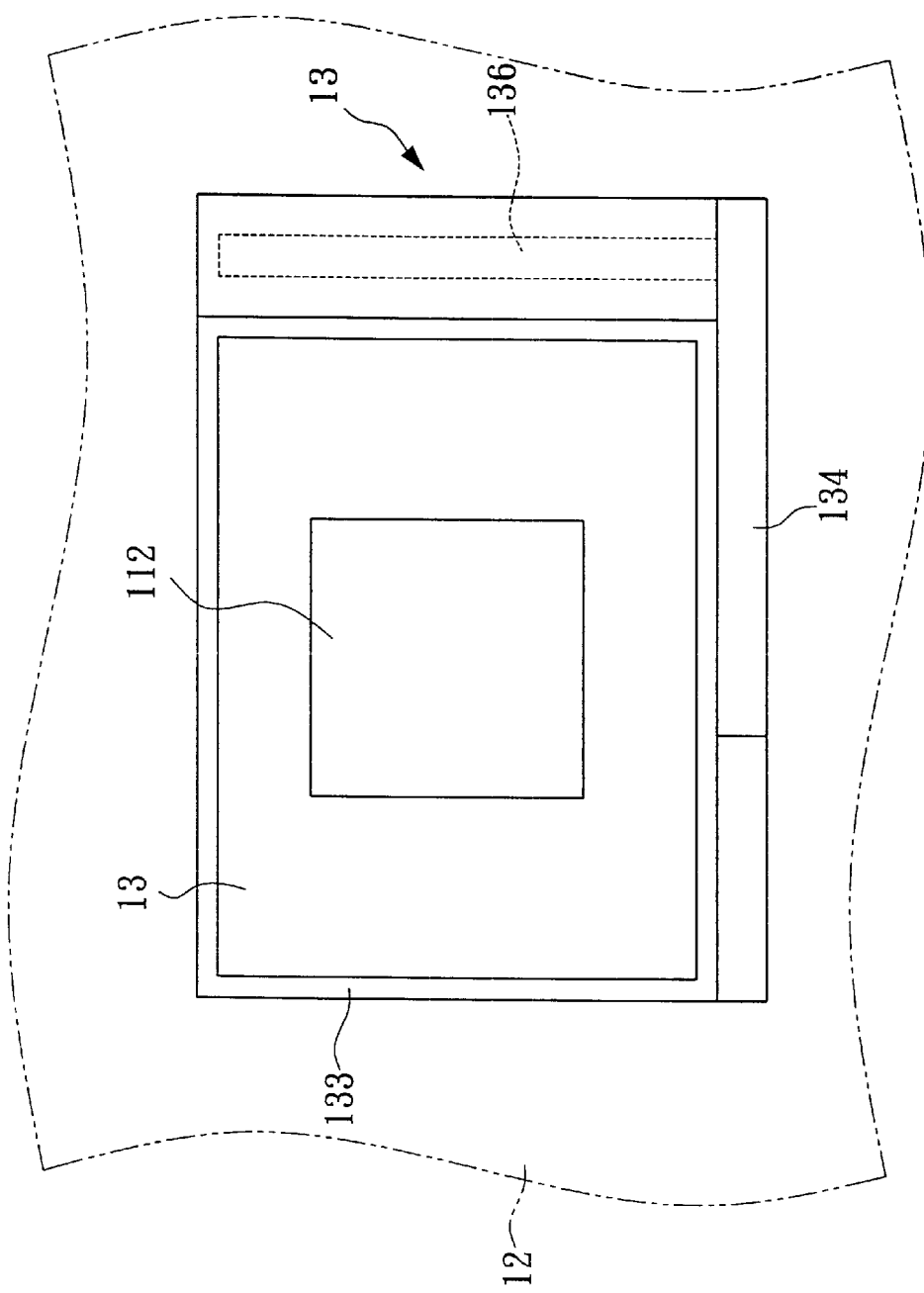
FIG. 2 shows the upper view of the composition of the IC device and the pin-style electrical connection device and the main board in prior art shown in FIG. 1.
Figure 3:
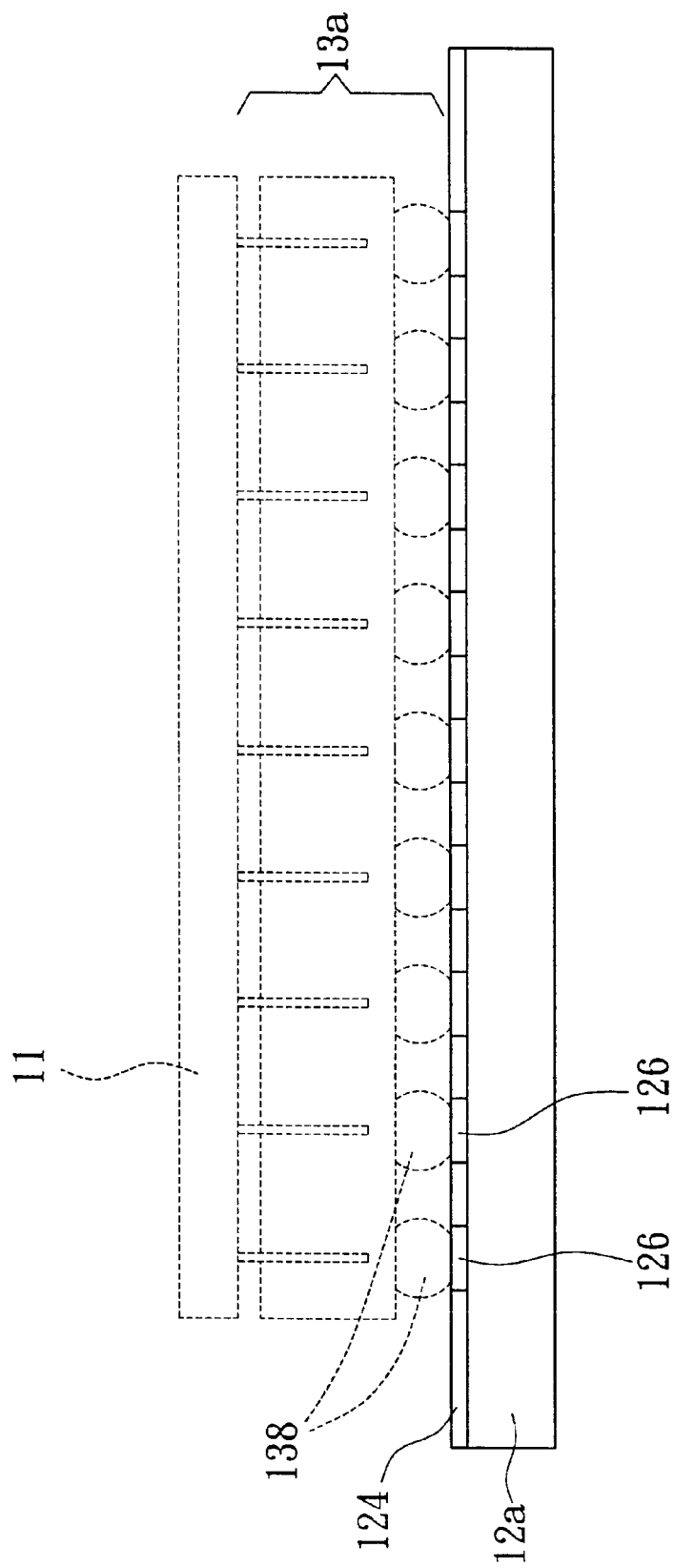
FIG. 3 shows the side view of the composition of the IC device and the ball-style electrical connection device and the main board in prior art.
Figure 4:
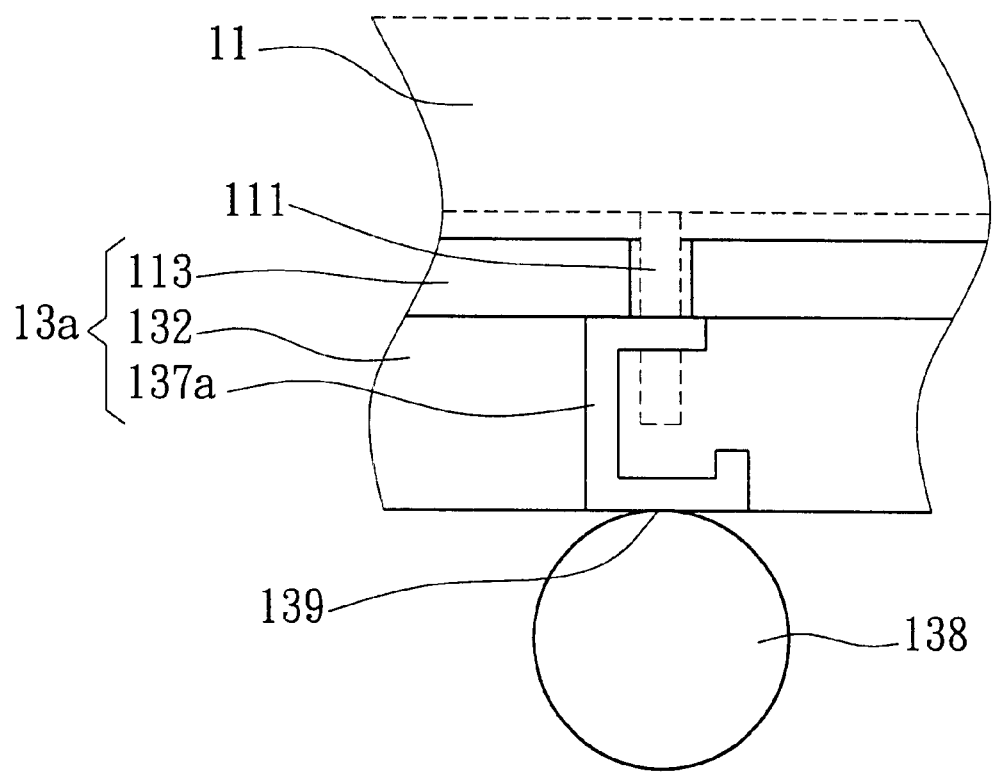
FIG. 4 shows the enlarged view of the electrical conducting holder part of the electrical connection device in prior art in FIG. 3.

The additional surface treatment can be used to lower down the adsorption of the solder ball 31 when overflow happened. The surface treatment can be applied on the inner surface and the outer surface around the area of the contact area of the solder pad 343 and the bottom part of the extension part 341 of the electrical conducting holder 34 just as shown in FIG. 7. Such surface treatment can form several fine cuttings around said area 3411 to make the surface oxidized, or to spread the organic solder-masking material or other methods in prior art. Therefore, the extra solder will not be absorbed around the area 3411. Also, in present invention, a portion of the solder balls will flow into the part of the upper end of the PTH 41 of the main board 40 in solder reflow process, which will make the solder balls 31 to form a mushroom-shape structure that comprising the upper mushroom part on the upper surface of the main board 40 and the lower mushroom part that flowing through the PTH 41. The lower mushroom part will contact the inner surface electrical conducting layer 43 of the PTH 41. Comparing with the co-planarity solder ball technology that employed by the main board in prior art shown in FIG. 3, the present invention is employing the main board 40 with PTH 41 to process the solder reflow with the electrical connection device of the present invention, which will also increase the contact area between the solder ball and the PTH 41 to improve the coupling effect. However, the electrical connection device of the present invention will also be applied on the circuit board (with solder pads and without PTHs) in prior art shown as FIG. 3 for SMT type.

In the following embodiments, since most of the devices are the same as or similar to the ones in the embodiment described above, the same device will adapt the same name and the same number as previously, however, the similar device will adapt the same name but the same number with a additional English letter for distinction.

Figure 8A:
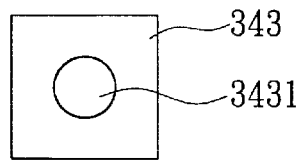
FIG. 8A to FIG. 8H show the bottom view of several embodiments of the hole and the solder pad of the electrical conducting holder in the electrical connection device in the present invention.
Figure 8E:
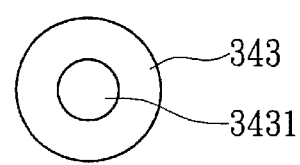
Figure 8B:
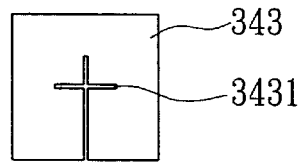
Figure 8F:
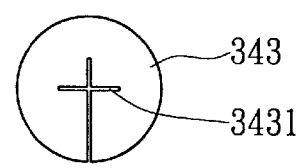
Figure 8C:
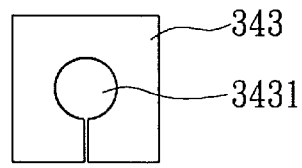
Figure 8G:
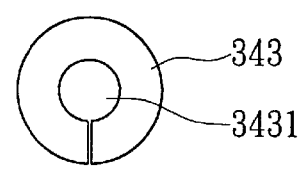
Figure 8D:
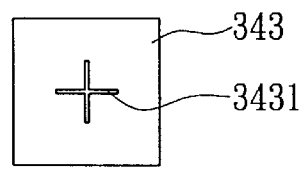
Figure 8H:
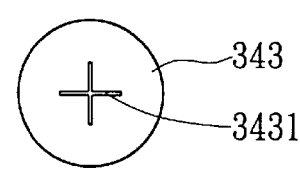

Please refer to FIG. 8A to FIG. 8H. The diagrams are showing the bottom schematics of embodiments of the solder pad of the electrical conducting holder 34 of the present invention. As shown in FIG. 8A, the bottom schematics of the solder pad 343 and the holes (the geometry structure 3431) are the square-shape structure with the close-state circular hole in the middle part, while in the FIGS. 8B, 8D, 8F and 8H, the holes are in cross shape. And the outer shape around the solder pad 343 can be a circle but not a square shape in FIG. 8E to FIG. 8H. The part of the hole is extended from the outer rim of the solder pad and in a open shape as shown in FIG. 8B, FIG. 8C, FIG. 8F and FIG. 8G. The open shape is relatively easy to manufacture. Certainly, the shapes of the holes can not only be circle shape or cross-shape as shown in FIG. 8A to FIG. 8H but also a polygon, a multi-hollow shape, a wave-shape or other irregular shapes.

Figure 9:
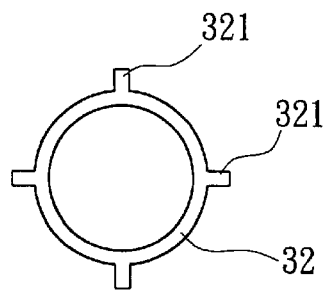
FIG. 9 shows the view of the embodiment of the contact ring in the electrical connection device in the present invention.

Please refer to FIG. 9, which is showing a preferred embodiment of the contact ring 32 of the present invention. On the outer ring of the contacting ring 32, some extension 321 are placed to increase the intensity of the combination of the contact ring 32 and the bottom surface of the socket 39. The extension 321 can also be used for coupling purpose for the bottom circuits of the socket 39.

Please refer to FIG. 10A to FIG. 10G. There are several combinations of the embodiments in which the solder pad 343 of the electrical conducting holder 34 and the contact ring 32 of the present invention. The following descriptions only illustrated the major difference.

Figure 10A:
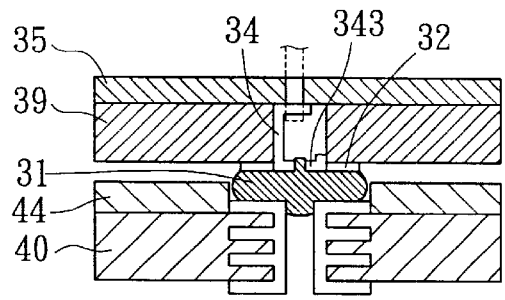
FIG. 10A to FIG. 10G show the views of the several different embodiments of the contact ring and the solder pad of the electrical conducting holder in the present invention.

FIG. 10A is similar to FIG. 6 in general, the only difference is that the contact ring 32 and the solder pad 343 are on the same horizontal plane and are protruding from the bottom of the socket 39.

Figure 10D:
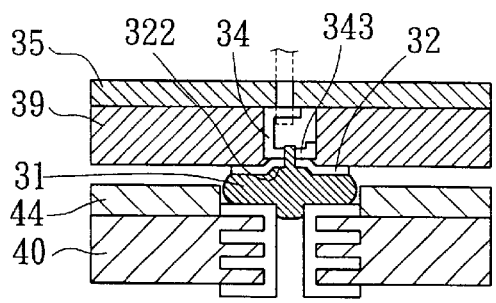
Figure 10B:
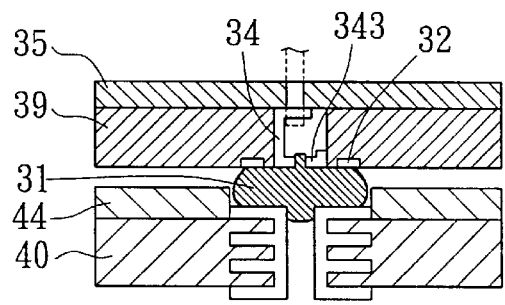

The difference that FIG. 10B differs from FIG. 10A is that the bottom of the socket 39, the contact ring 32 and the solder pad 343 are on the same horizontal plane.

Figure 10E:
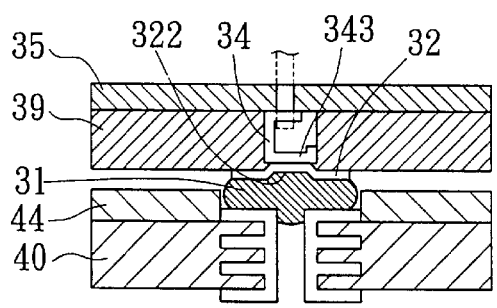
Figure 10C:
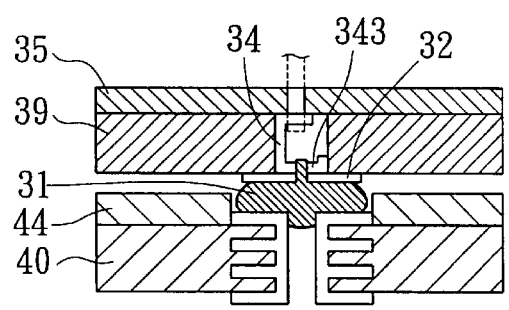

The difference that FIG. 10C differs from FIG. 6 is that the inner diameter of the contact ring 32 in FIG. 10C is smaller than the one of the hole 39.

The difference that FIG. 10D differs from FIG. 10C is that the contact ring 32 in FIG. 10D is a central hollow disk shape structure with a central concave part 322 which is stick to the solder pad 343, and the outer rim of the contact ring 32 is stick to the bottom of the socket 39. The difference that FIG. 10E differs from FIG. 10D is that the contact ring 32 in FIG. 10E is a disk shape structure but with no central hole, and with the disk-shape contact ring 32, the contact area thereof with the solder ball 31 is enlarged.

Figure 10F:
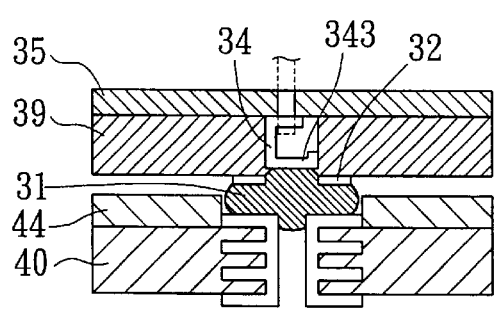

The difference that FIG. 10F differs from FIG. 6 is that the solder pad 343 in FIG. 10F is with no hole structure, and the horizontal position of the solder pad 343 is litter shrinking inward to the hole 39. With the difference in height between the contact ring 32 and the solder pad 343, the contacting area with solder ball 31 is enlarged.

Figure 10G:
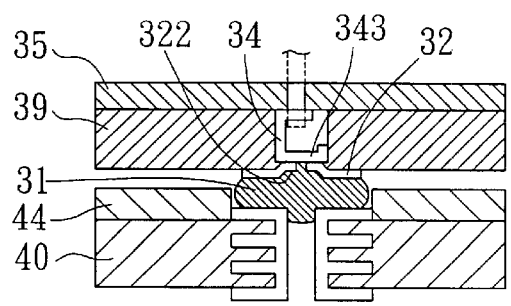

The difference that FIG. 10G differs from FIG. 10F is that the contact ring 32 in FIG. 10G is a central hollow disk shape structure with a central concave part 322 which is stick to the solder pad 343, and the outer rim of the contact ring 32 is stick to the bottom of the socket 39.

Figure 10H:
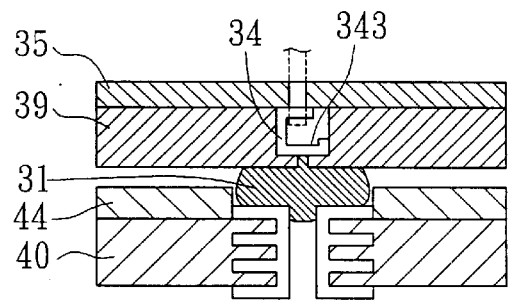
FIG. 10H shows the view of the embodiment that has no contact ring on the solder pad of the electrical conducting holder in the present invention.

The FIG. 10H is showing another embodiment of the present invention. As shown, there is no contact ring placed on the solder pad of the electrical conducting holder; obviously, the contact ring is optional in present invention.

Figure 11A:
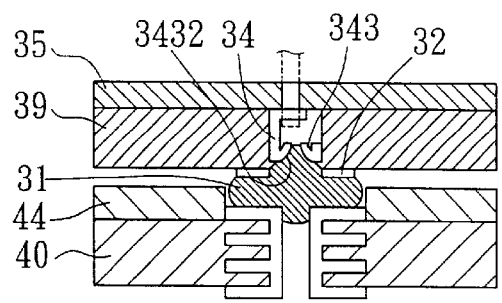
FIG. 11A to FIG. 11C show the views of the several embodiments around the holes on the slope on the solder pad in the present invention.
Figure 11B:
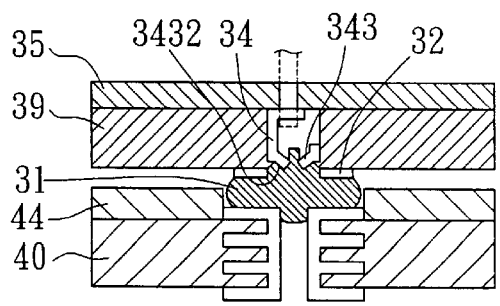

Certainly, the geometry structure 3431 of the solder pad 343 can be different shape structure other than the shape shown in previous embodiments, the shape can be slope, concave or protruding shape. In the FIG. 11A to FIG. 11C, the embodiment is showing the solder pad 343 with the slope plane 3432 placed around the rim of the hole. FIG. 12A and FIG. 12B are showing the concave and protruding structure placed on the solder pad 343.

The difference that FIG. 12A differs from FIG. 6 is that the slope plane 3433 is placed around the rim of the hole (the geometry structure 3431) of the solder pad 343, and the slope shape 3432 is sloping toward the inner side (the top of the socket 39) of the hole.

The difference that FIG. 12B differs from FIG. 12A is that the slope plane 3433 sloping toward the outer side (the bottom of the socket 39) of the hole.

Figure 11C:
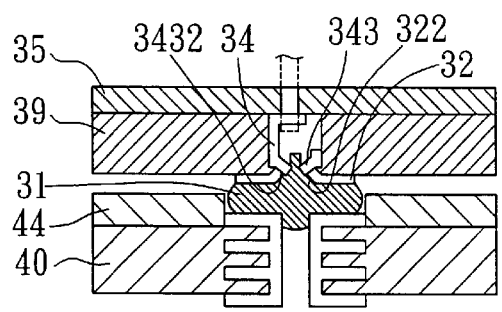
Figure 12A:
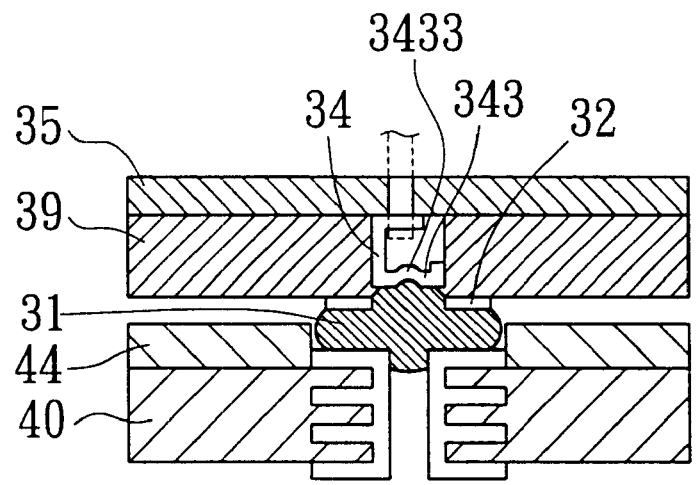
FIG. 12A to FIG. 12B show the views of the several embodiments in the convex and concave parts on the solder pad in the present invention.
Figure 12B:
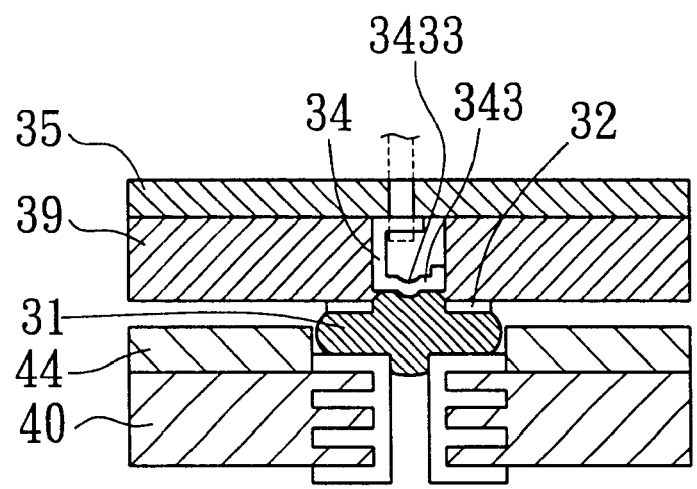

The difference that FIG. 11C differs from FIG. 12B is that the contact ring 32 is a hollow disk structure but not a flat plane structure.

The difference between FIG. 6 and FIG. 12A is that the solder pad 343 is without hole but is with a concave part 3433 used as the geometry structure 3431 and formed by compress, and the concave part 3433 is indenting toward the inner side (the top of the socket 39) of the hole.

Other example of the concave part 3433 can be round shape, cross shape, polygon, trough shape, ring shape, wave shape or irregular shape.

The difference between FIG. 12A and FIG. 12B is that the protruding part 3433 in FIG. 12B is protruding toward the outer side (the bottom of the socket 39) of the hole.

Figure 13A:
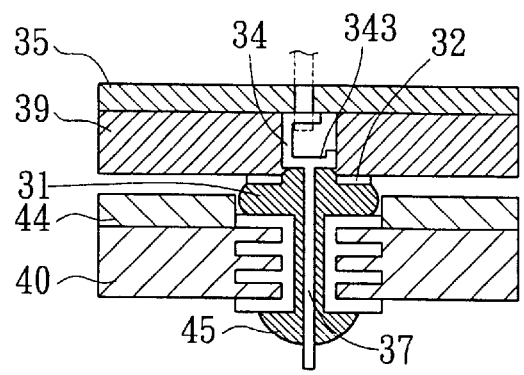
FIG. 13A to FIG. 13C show the views of the several pin-style embodiments in the present invention.
Figure 13B:
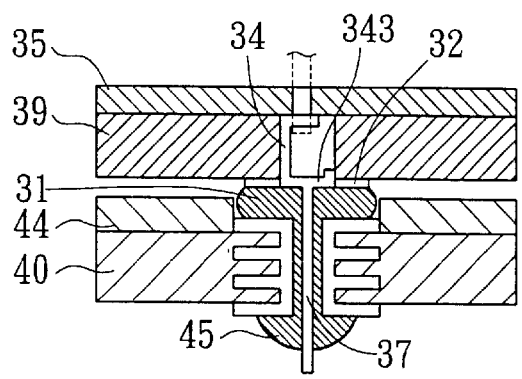
Figure 13C:
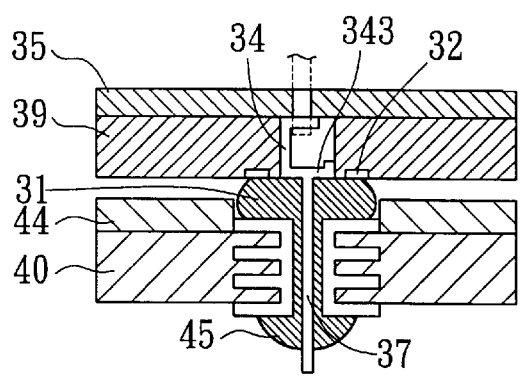

Even the electrical connection device 30 of the present invention is adapting the solder ball 31 to combine the circuit board 40, the pin style structure is another option. As shown in FIGS. 13A, 13B and 13C, on the bottom of the solder pad, there is a extending pin 37 that can be used to insert into the PTH 41 of the circuit board 40 and can be soldered with solder ball 45 for connection firmly.

The different structure that being mentioned in this disclosure includes: (a) the concave or protruding part, the holes and the slope plane that being placed on the solder pad (b) the shape of the aforesaid concave or protruding part, the holes or the slope plane can be round, cross, polygon, trough, ring, wave or irregular (c) an optional contact ring that can be hollow, non-hollow ring or disk structure (d) the solder pad that can be shrink in the pin hole or as plane as the bottom of the socket, the contact ring can be protruding from the hole or as plane as the bottom of the socket. (e) the plane of the solder pad and the contact ring can be on the same level or on different level. Any combination and arrangement of (a) to (e) can be made to provide the similar function and effect that present invention focus. More, in the previous embodiments, the electrical connection of the present invention is always connected with the PTH style circuit board, it is also suitable for the conventional non-PTH circuit board.

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment, without departing from the scope and the spirit of the present invention.

What is claimed is:

1. An electrical connection device, which provides an electrical connection with a pin-style IC package, comprising:

an electrical conducting holder, which comprises:
   an extension part;
   a holder part positioned on one end of the extension part and angled with respect to the extension part, the holder part being bent to form a hollow for insertion and contact of a pin; and
   a solder pad positioned on another end of the extension part and perpendicular with the extension part, and at least one geometrical structure provided on the bottom surface of the solder pad, wherein the geometrical structure has at least one through hole that has a rim, and the bottom surface of the solder pad has at least one convex-concave part positioned around the rim of the through hole.

2. The electrical connection device of claim 1, wherein the electrical conducting holder is a single element formed by bending a metal material.

3. The electrical connection device of claim 1, wherein the holder part comprises two holders which are separated from each other by a space and extending in the same direction, said two holders being bent and extended in unparallel manner so that the space between the two holders forms a bigger space and a smaller space, and the bigger space will receive and hold the pin.

4. The electrical connection device in claim 1, wherein the shape of the convex-concave part is selected from the group consisting of: circle, cross, polygon, trough, ring, wave and irregular.

5. The electrical connection device in claim 1, wherein the shape of the through hole is selected from the group consisting of: circle shape, polygon, cross shape, trough shape, wave shape and irregular shape.

6. The electrical connection device in claim 1, wherein a part of the through hole extends toward the rim of the bottom surface of the solder pad to make the through hole in an open state.

7. The electrical connection device in claim 1, further comprising:
   a socket, on which at least one pin hole exists, wherein the electrical holder is placed in the pin hole in a manner with the holder and the solder pad facing the pin hole on the top and bottom side respectively; and
   a solder ball, which is placed on the solder pad.

8. The electrical connection device in claim 7, wherein at least one holding structure in convex-concave shape is provided on the extension part of the holder, with the holding structure providing a holding force toward the inner surface of the pin hole of the socket to prevent the electrical conducting holder from dropping.

9. The electrical connection device in claim 7, wherein the solder ball is composed of Sn/Pb with a ratio between 60/75 and 40/25.

10. The electrical connection device in claim 1, wherein the area adjacent the another end where the extension part of the holder and the solder pad is connected has a surface treatment that reduces the adsorption of solder material by the area.

11. The electrical connection device in claim 10, wherein the surface treatment forms several fine cutting traces around the area.

12. The electrical connection device in claim 10, wherein the surface treatment is surface oxidization.

13. The electrical connection device in claim 10, wherein the surface treatment coats a solder-masking material on the area.

14. An electrical connection device, which provides an electrical connection with a pin-style IC package having a plurality of pins, comprising:

a socket on which a plurality of pin holes exist, the positions of the pin holes corresponding to the plurality of pins of the IC package respectively;
   a plurality of electrical conducting holders positioned in the pin holes respectively, each electrical conducting holder comprising:
      an extension part positioned in a corresponding pin hole;
      a holder part positioned at one end of the extension part at a predetermined angle with respect to the extension part and
      a solder pad positioned at another end of the extension part at another predetermined angle with respect to the extension part, and at least one geometrical structure provided on the bottom surface of the solder pad, wherein the geometrical structure has at least one through hole that has a rim, and the bottom surface of the solder pad has at least one convex-concave part positioned around the rim of the through hole; and
   a plurality of solder balls being positioned respectively on the solder pads of the plurality of electrically conducting holders.

15. The electrical connection device in claim 14, wherein the holder part comprises two holders which are separated from each other by a space and extending in the same direction, said two holders being bent and extended in unparallel manner so that the space between the two holders forms a bigger space and a smaller space, and the bigger space will receive and hold the pin, and the electrical connection device further comprising:
   a slide cover mechanism positioned on a side surface of the IC package along the direction of the socket for sliding movement such that when the pin-style IC package is inserted in the holes of the socket, the slide cover mechanism is moved in a limited distance to push the pins from the bigger holding space toward the smaller holding space to hold the IC package firmly.

16. The electrical connection device in claim 14, wherein a part of the through hole extends toward the rim of the bottom surface of the solder pad to make the through hole in an open state.

17. The electrical connection device in claim 14, wherein a surface treatment is applied on the area adjacent the another end where the solder pad and the extension part of the electrical conducting holders is connected to reduce the adsorption of the solder material at the area.

18. The electrical connection device in claim 14, wherein at least one holding structure in convex-concave shape is provided on the extension part of the holder, with the holding structure providing a holding force toward the inner surface of the hole of the socket to prevent the electrical conducting holder from dropping.

19. The electrical connection device in claim 14, wherein the electrical connection device further comprises:
   a contact ring positioned adjacent the rim and facing toward the solder pad.

20. The electrical connection device in claim 19, wherein the contact ring is a hollow ring structure.

21. The electrical connection device in claim 19, wherein the contact ring is a disk structure.

22. The electrical connection device in claim 19, wherein at least one part of the contact ring and the solder pad are on different horizontal planes.

23. The electrical connection device in claim 14, wherein the solder ball is composed of Sn/Pb with a ratio between 60/75 and 40/25.

24. The electrical connection device in claim 17, wherein the surface treatment forms several fine cutting traces around the area.

25. The electrical connection device in claim 17, wherein the surface treatment is surface oxidization.

26. The electrical connection device in claim 17, wherein the surface treatment coats a solder-masking material on the area.

* * * * *